United States Patent
Tellkamp

(12) 
(10) Patent No.: US 6,692,633 B2
(45) Date of Patent: Feb. 17, 2004

(54) SACRIFICIAL ANODE FOR CORROSION PROTECTION OF SEMICONDUCTOR METALLIZATION DURING SAWING

(75) Inventor: John P. Tellkamp, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 208 days.

(21) Appl. No.: 10/026,859

(22) Filed: Dec. 21, 2001

(65) Prior Publication Data

US 2002/0081776 A1 Jun. 27, 2002

Related U.S. Application Data

(60) Provisional application No. 60/257,690, filed on Dec. 22, 2000.

(51) Int. Cl.$^7$ ................................................ C23F 13/00
(52) U.S. Cl. .................. 205/733; 205/730; 205/731; 205/657; 205/663; 204/196.1; 204/196.18; 204/196.24; 204/196.28
(58) Field of Search ................... 204/196.28, 196.1, 204/196.24, 196.18; 205/733, 730, 731, 657, 663

(56) References Cited

U.S. PATENT DOCUMENTS

| | | | | | |
|---|---|---|---|---|---|
| 4,381,981 | A | * | 5/1983 | Maes | 204/196.04 |
| 5,876,575 | A | * | 3/1999 | Kump | 204/248 |
| 6,522,010 | B2 | * | 2/2003 | McTeer | 257/765 |
| 6,524,965 | B2 | * | 2/2003 | Chen | 438/746 |

* cited by examiner

Primary Examiner—Bruce F. Bell
(74) Attorney, Agent, or Firm—Wade James Brady, III; Frederick J. Telecky, Jr.

(57) ABSTRACT

Resistance to corrosion of aluminum metallization on semiconductor devices during wafer sawing process is provided by a sacrificial anode containing magnesium in contact with the integrated circuit wafer and the dicing saw. A relatively thin film or disc of magnesium directly in contact with the surface of the dicing blade makes use of cooling water to serve as the electrolyte between the magnesium and aluminum surfaces, and in turn corrosion is transferred to the magnesium anode in preference to the aluminum of the semiconductor device.

17 Claims, 3 Drawing Sheets

SACRIFICIAL ANODE FOR CORROSION PROTECTION OF SEMICONDUCTOR METALLIZATION DURING SAWING

This application claims priority under 35 U.S.C. §119 based upon Provisional Patent Application No. 60/257,690 filed Dec. 22, 2000.

FIELD OF THE INVENTION

This invention relates to a method for corrosion protection of thin film metal conductors on semiconductor devices, and more particularly corrosion initiated during sawing of semiconductor wafers.

BACKGROUND OF THE INVENTION

A patterned thin film of aluminum or one of its alloys is widely used as the conductor which interconnects structures on integrated circuits and forms the input/output pads on the circuits. It has emerged as the material of choice because of its low resistivity, and because of its compatibility with silicon oxide and other materials used in fabrication of integrated circuits. Such films are deposited as polycrystalline materials, usually in the 0.5 to 1.5 micron thickness range.

Aluminum alloys are used more frequently than pure aluminum because they possess enhanced properties with certain interconnect requirements, including superior contact formation, and better resistance to electromigration. Among the alloys commonly used are aluminum with 2 or 4 weight percent copper, aluminum with 1 weight percent silicon, and aluminum with 1 weight percent silicon and 2 weight percent copper.

While aluminum has excellent properties for integrated circuit conductors, it also does suffers from some problems, among them is that it is readily corroded. Dry etching of aluminum may leave a chloride residue on the aluminum surface and exposure to moisture can lead to formation of HCl, which in turn reacts with aluminum to produces $AlCl_3$.

If copper is present as an alloy in the aluminum film, severe corrosion can occur, because $CuAl_2$ and aluminum form a galvanic couple with HCl acting as the electrolyte, and driving the corrosion more rapidly than in pure aluminum films. Consequently, the amount of residual chloride necessary to induce corrosion is much lower when copper is present in the aluminum film.

The interconnection circuitry on a chip is largely covered by a dielectric film of silicon oxide, silicon nitride, or other impervious substance, but the input/output sites or bond pads are not covered by the protective overcoat in order to provide for connection of wire bonds or other metallic contacts to an external circuit. Therefore, these pads are subjected to moisture and to other forms of contamination which may lead to corrosion.

Following fabrication of the circuits on a wafer, and covering the circuitry with a protective overcoat, one of the next process steps is dicing or sawing the wafer into individual chips. Typically, the wafer is held on a chuck, a diamond impregnated saw blade is aligned to scribe lines on the wafer, and the computer operated saw dices the wafer while using high purity water as coolant.

A second source of corrosion is introduced solely during the sawing process. Corrosion is electrochemical in nature and the rate of corrosion is dependent on the ability of electrons to move through the materials and electrolytes involved in the reaction. To minimize corrosion, during the sawing process, the cooling water used is very pure, typically 10 Meg ohm-cm. The high resistivity has a disadvantage of allowing a build up of static charge. The charge can cause damage to chip circuits, as well as accelerate bond pad corrosion. Further, the static electricity makes removal of silicon particles generated during sawing difficult, and after sawing, accumulations of particles remain where water is trapped between the particles by capillary action. With the charge on the surface, water will ionize allowing movement of the electrons which in turn initiate corrosion. It has been noted that the chip circuitry acts to distribute the charge, causing specific areas and bond pads on the chip to demonstrate obvious discoloration, or initial stages of corrosion after sawing. If some conductivity is introduced to the water, typically by bubbling $CO2$, the same ionization allows corrosion to occur.

Yet another source of aluminum corrosion during sawing has been proposed, as erosion-corrosion from a high velocity of liquid impinging on the exposed metal pads causing mechanically initiated corrosion.

The multiple sources for corrosion of exposed thin film aluminum during the dicing process are highly aggravated in the copper alloys of aluminum. Corrosion is not only a latent reliability issue for integrated circuit devices, but also is a yield issue as a result of interference with the wire bonding process. It is difficult to make the gold wire adhere and form the strong intermetallics necessary for reliable devices with dark or partially corroded bond pads. Further, the discoloration causes difficulty with the vision system of high speed wire bonding equipment and thus decrease yield and through-put.

It would be advantageous to the industry if corrosion of interconnection metallization and bond pads could be inhibited or altogether prohibited.

SUMMARY OF THE INVENTION

An objective of the current invention is to provide a method for preventing corrosion of aluminum metallization on integrated circuit devices wherein the corrosion is initiated during wafer sawing.

Another objective of the current invention is to provide a dicing saw structure which inhibits corrosion of aluminum.

It is an object of this invention to provide a sacrificial anode which corrodes preferentially to aluminum during the sawing process.

It is further an objective of this invention to provide a cost effective means of eliminating aluminum corrosion initiated during the sawing process.

It is an object of the invention to provide a method for inhibiting corrosion of interconnect metallization on integrated circuit devices without requiring extra processing steps, or significant changes to the dicing equipment.

It is an objective of this invention to improve reliability of integrated circuits by avoiding corrosion initiated during wafer dicing.

It is still yet another objective of the invention to increase yield at the wire bond operation by eliminating bond pad corrosion resulting from the sawing process.

These objectives are met by providing a sacrificial anode containing magnesium in contact with the integrated circuit wafer during the sawing or dicing process. A galvanic couple allows corrosion of the metal having the lowest potential, magnesium (−2.36 volts), to corrode in preference to aluminum (−1.67 volts) using cooling water as the electrolyte. The magnesium anode is preferably provided as a relatively thin film directly in contact with the surface of the dicing blade.

Alternately, a disk containing magnesium which extends below the surface of the cooling water and is secured alongside the dicing blade. A third embodiment provides a source of magnesium positioned under the wafer.

It has long been known that corrosion of aluminum is significantly reduced by the presence of magnesium, or magnesium in combination with other metals, such as zinc and manganese serving as a sacrificial anode, and therefore, the presence of a magnesium sacrificial anode during the wafer sawing process prevents corrosion of thin film aluminum on an integrated circuit by transferring corrosion to the magnesium. "Registration Record of International Alloy Designation and Chemical Composition Limits for Wrought Aluminum and Wrought Aluminum Alloys", revised Sep. 1, 1976 and published by Aluminum Association, Inc. provides information on alloys which inhibit aluminum corrosion.

The foregoing and other objectives, features and advantages will become more apparent from the following detailed description of preferred embodiments which proceeds with reference to the accompanying drawings.

DETAILED DESCRIPTION OF THE INVENTION

Figure 1:
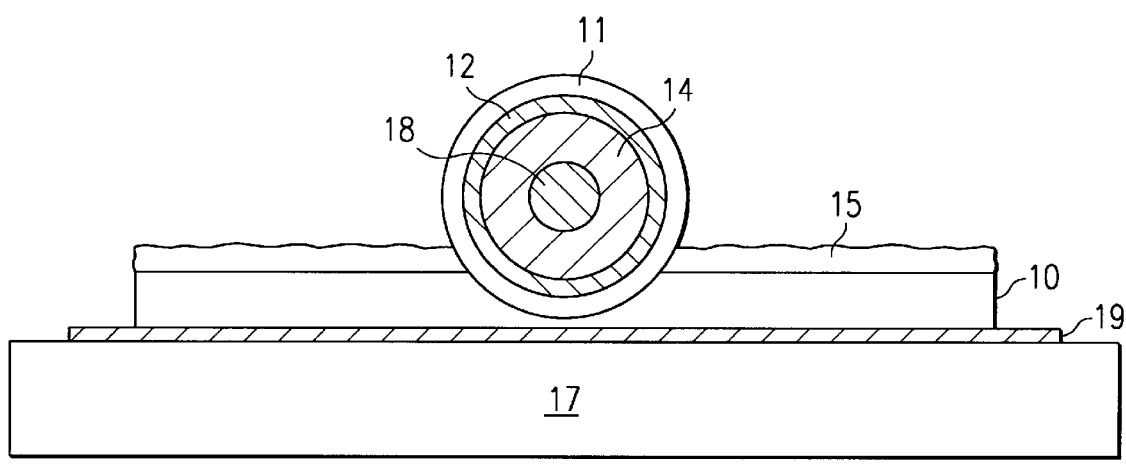
FIG. 1 is a diagrammatic side view of a dicing saw blade of the current invention mounted on a spindle.

FIG. 1 illustrates a semiconductor wafer 10 in contact with a diamond impregnated blade 11 of a dicing saw, wherein said blade has a sacrificial anode 12 affixed to the blade. A pair of flanges 14 support the blade 11, and the blade and flanges are mounted on a spindle 18 for rotation about a spindle axis. The wafer 10 is supported on a saw chuck 17, and the wafer is secured by an adhesive 19. The blade and work surface of the wafer are flooded by high purity water 15. In exiting technology, the water serves to cool the blade and the sawed surface, and to remove the debris. In the current invention, the water further serves as the electrolyte between aluminum on the wafer surface, and the sacrificial anode on the blade. By this process, corrosion of the magnesium having a lower galvanic potential (−2.36 Volts) is corroded in preference to the aluminum on the semiconductor device.

Figures 2A, 2B:
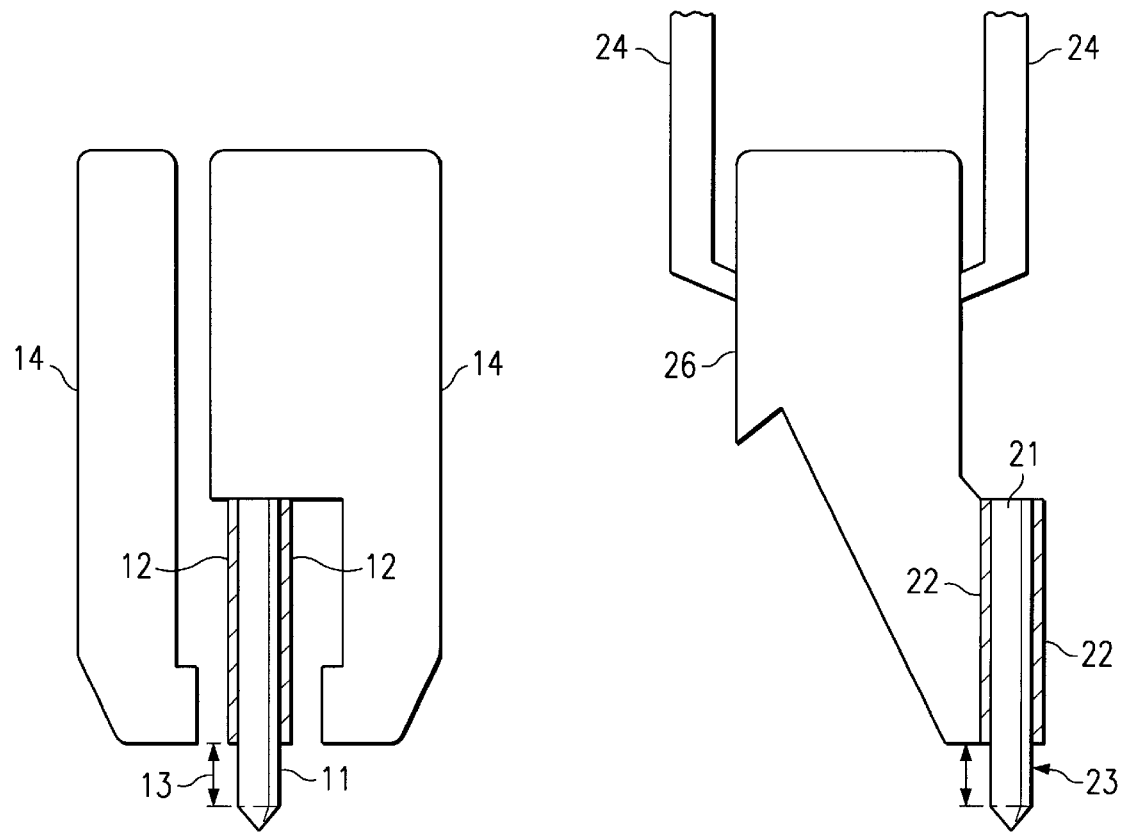
FIG. 2a is a cross sectional view of a dicing blade with sacrificial anode and flanges.
FIG. 2b is a cross section of a hub type saw blade with sacrificial anode.

In order to better understand the spatial relationship between the exposed or available cutting surface of the saw blade, the sacrificial anode, and the flanges, FIG. 2a shows a cross section of the blade 11 with a flange pair 14. The outer diameter of the dicing blade is greater than the diameter of each flange 14, thus providing an exposed blade portion 13 extending radially outward from the flange pair which will be partially or wholly consumed during the life time of a blade. The narrow blade exposure, typically desired to be at about 0.05 inches, gives the thin blade its stiffness sufficient for cutting into the wafer, and depth to penetrate through the wafer.

In the current invention, the sacrificial anode 12 is a thin film, in the range of 4,000 to 10,000 Angstroms thick, comprising magnesium or a magnesium alloy. The magnesium film deposited primarily on the unexposed portion of the blade. In practice, the magnesium is typically limited to no more than 0.01 inches protruding onto the exposed blade in order to avoid "loading" or clogging by soft metal particles of the spaces between the diamond particles on the cutting surface, and to avoid metal particulate contamination on the wafer surface. In principle, as a sacrificial anode the magnesium covers or partially covers the blade whereby contact is made between the aluminum on the chip surface and the magnesium.

Another saw blade arrangement typically found in the industry is a hub type blade. In FIG. 2b, the blade 21 having a exposed area 23 is mounted on a hub 26, and the sacrificial anode 22 is positioned similarly to that illustrated in FIG. 2a for blade and flange type assembly wherein the anode is largely provided on the unexposed portion of the blade. The hub 26 provides support for the fragile blade, and is held by flanges 24 or wheel mounts. The sacrificial anode 21 comprises a film of magnesium or a magnesium alloy.

Figure 2C:
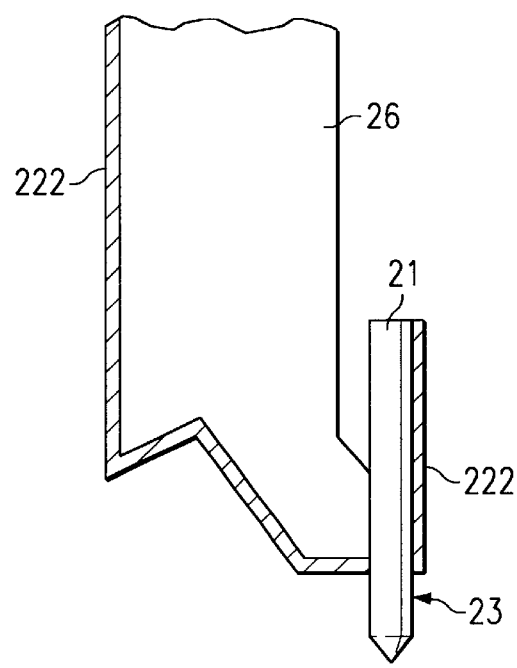
FIG. 2c is a cross section of a hub saw blade having magnesium deposited on the hub as well as blade.

In yet another embodiment, shown in FIG. 2c, the sacrificial anode 222 is deposited not only on the blade 21, but onto the hub 26 as well. This configuration allows magnesium to be deposited onto the surface of the blade and hub after assembly, and requires masking only the active blade surface.

Figure 3:
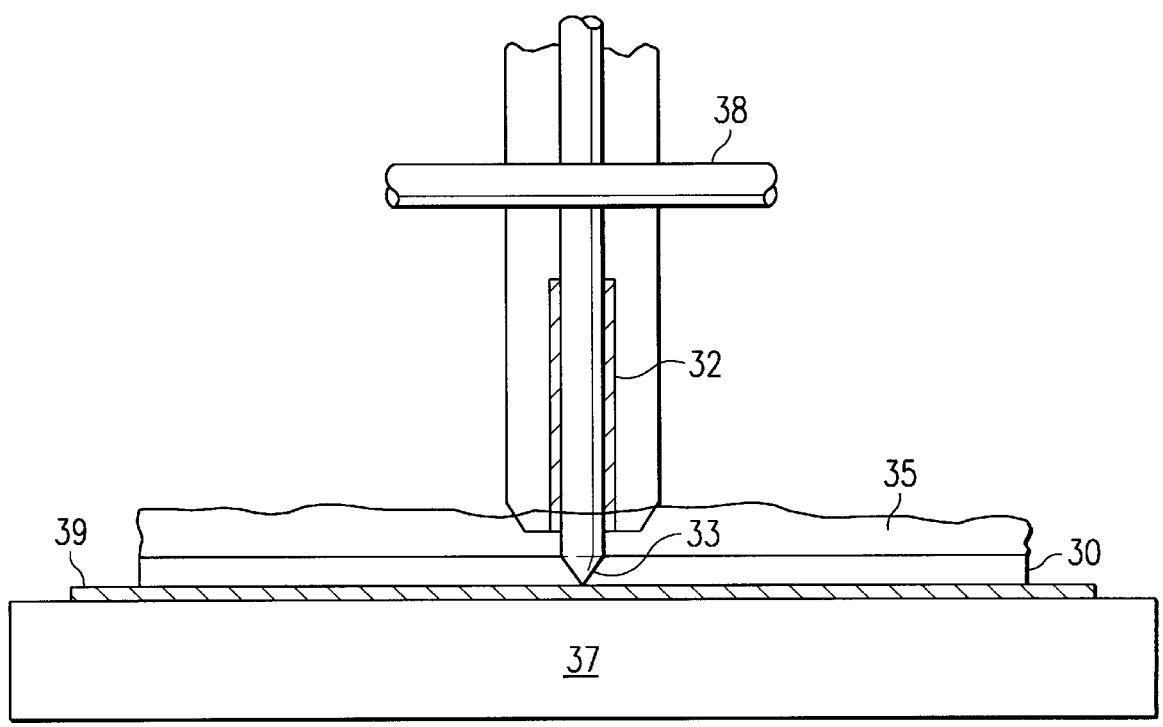
FIG. 3 is a cross sectional view of a dicing saw blade of the current invention demonstrating the relationship exposed blade and sacrificial anode.

FIG. 3 illustrates a silicon wafer 30 having aluminum bond pads and interconnections being diced or singulated into individual chips. The diagram shows the spatial relationship between wafer 30, the exposed portion of a blade 33, the sacrificial anode 32, and the cooling water 35 which serves as the electrolyte between the aluminum and magnesium surfaces. The wafer 30 supported on a chuck 37, and held by an adhesive surface 39 is diced by the blade rotating on a spindle 38 while water 35 covers the surface. The water cools both the blade and wafer, removes silicon debris, and allows charge flow between the magnesium sacrificial anode and exposed aluminum on the wafer surface. Electrical contact to the wafer is by the mechanical contact sensing mechanism on the saw mechanism.

Figure 4:
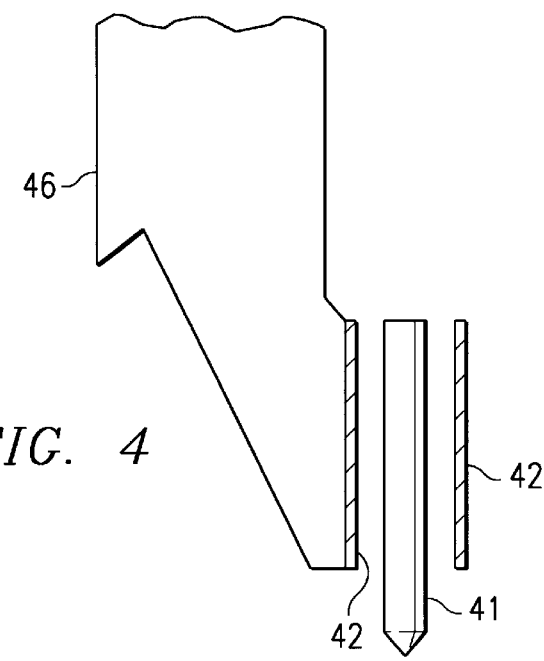
FIG. 4 illustrates an embodiment of a saw blade with a magnesium disk as a sacrificial anode.

The preferred sacrificial anode embodiments illustrated in FIGS. 2a, 2b, and 2c is a deposited thin film comprising magnesium or a magnesium alloy. In an alternate embodiment, shown in FIG. 4, a disc or disc pair (42) of magnesium or a magnesium alloy is positioned against the blade 41, and supported by either a hub 46 or flange (not shown) arrangement. A thin disc of magnesium, or an alloy of magnesium, in the range of 0.005 to 0.015 inches thick having an opening in the center, is adhered to or held in compression against a diamond dicing blade. Diameter of the disc is about 0.080 to 0.120 inches less than the diameter of the blade so that the disc has minimal protrusion beyond the supporting flange or hub structure in order to avoid interference with the dicing blade operation. This disc embodiment has the advantage to the blade supplier of requiring no vapor deposition of the magnesium containing anode.

It should be understood that the precise size of the sacrificial anode in each of the embodiments is related to the dicing blade exposure, typically preferred to be about 0.05 inches. The magnesium anode is preferably positioned to extend 0.0 to 0.010 inches onto the exposure, and the actual anode size will be determined by the blade exposure. The magnesium anode is confined primarily to avoid loading of the space between diamond particles by soft metal particles as the blade exposed surface is eroded during usage.

Figure 5:
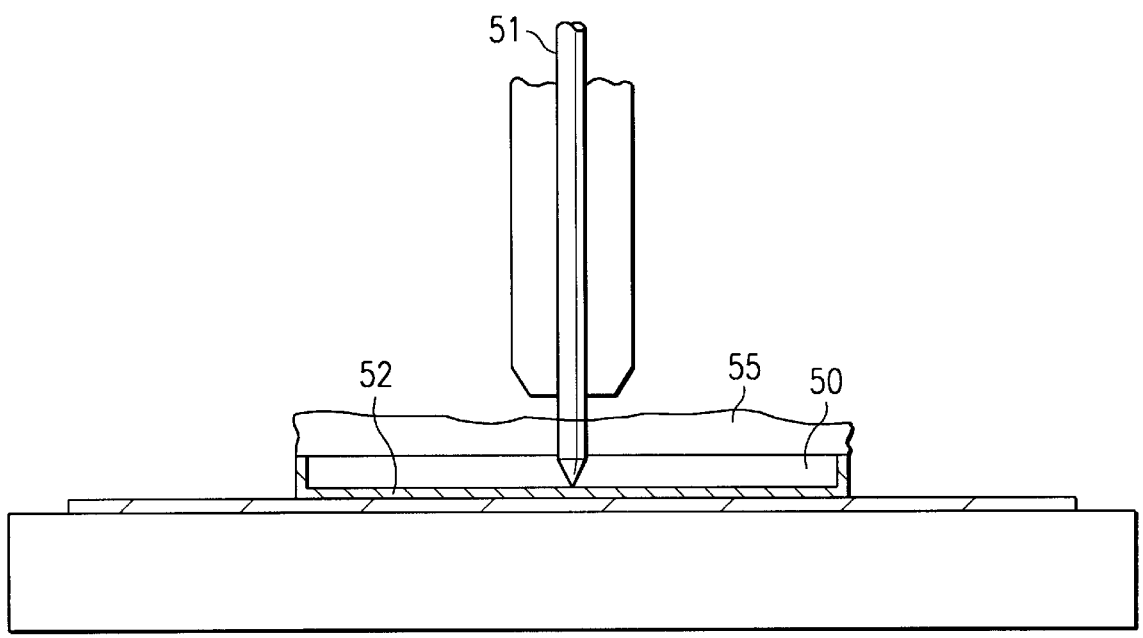
FIG. 5 illustrates an embodiment of a sacrificial anode affixed to the back of a wafer.

In FIG. 5, yet another embodiment of the magnesium containing sacrificial anode is illustrated in which a thin layer or film of magnesium 52 or magnesium alloy is positioned on or against the wafer backside 50. Contact is made by the saw mechanical contact sensing mechanism to the blade 51, and cooling water 55 serves as the electrolyte to conduct charge flow from the anode to the aluminum on the surface of the chip. A vapor deposited film on the wafer is in the range of 2,000 to 5,000 Angstroms thick, and is a magnesium alloy or magnesium metal.

While specific embodiments of the invention have been described above, it is to be understood that various modifications, may be made from the specific details herein without departing from the spirit and scope of the invention as set forth in the appended claims.

What is claimed is:

1. A method for improving resistance to corrosion of aluminum metallization on a semiconductor device wherein corrosion is initiated during sawing of a wafer, comprising the steps of;
   a) installing onto the saw spindle a dicing blade having a sacrificial anode in contact with the unexposed surface of the blade,
   b) placing a wafer onto the work surface of the dicing saw,
   c) flooding the work surface and said anode with a cooling solution of high purity water, and
   d) operating the dicing saw to bring the blade into contact with said wafer.

2. A method as in claim 1 wherein said sacrificial anode comprises magnesium.

3. A method as in claim 1 wherein said sacrificial anode comprises magnesium and zinc.

4. A method as in claim 1 wherein said dicing blade is a diamond impregnated blade having a film comprising magnesium in contact with one or more surfaces of the blade.

5. A method as in claim 1 wherein said sacrificial anode is a vapor deposited film in the range of 4,000 to 10,000 Angstroms thick.

6. A method as in claim 1 wherein said sacrificial anode is a disc comprising magnesium in the range of 0.005 to 0.015 inches thick.

7. A method as in claim 1 wherein said sacrificial anode extends 0.0 to 0.010 inches onto the blade exposure.

8. A method as in claim 1 wherein said dicing blade and sacrificial anode are supported by a flange pair.

9. A method as in claim 1 wherein said dicing blade and sacrificial anode are affixed to a hub.

10. A method as in claim 8 wherein said sacrificial anode extends onto said hub.

11. A method for improving resistance to corrosion of aluminum metallization on a semiconductor device wherein corrosion is initiated during sawing of a wafer, comprising the steps of;
    a) installing onto the saw spindle a dicing blade,
    b) placing a wafer having a sacrificial anode affixed to the backside of the wafer onto the work surface of the dicing saw,
    c) flooding the work surface and said anode with a cooling solution of high purity water, and
    d) operating the dicing saw to bring the blade into contact with said anode on the backside of the wafer.

12. A method as in claim 1 wherein said sacrificial anode is a thin film comprising magnesium.

13. A dicing saw blade for improving resistance to corrosion of aluminum metallization on a semiconductor device wherein corrosion is initiated during sawing of a wafer including;
    a diamond impregnated blade having a sacrificial anode comprising a deposited thin film of magnesium on one or more surfaces.

14. A dicing saw blade as in claim 13 wherein said sacrificial anode is in the range of 4,000 to 10,000 Angstroms thick.

15. A dicing saw blade as in claim 13 wherein said magnesium extends onto a blade support structure.

16. A dicing saw blade for improving resistance to corrosion of aluminum metallization on a semiconductor device wherein corrosion is initiated during sawing of a wafer including the following;
    a) a diamond impregnated blade,
    b) a sacrificial anode composed of a disc comprising magnesium, or a magnesium alloy affixed to one or more surfaces of said blade, and
    c) a means of supporting said blade and anode in contact with each other.

17. A dicing saw blade assemblage as in claim 16 wherein said disc is in the range of 0.005 to 0.015 inches thick.

* * * * *